US011336045B2

(12) United States Patent
Yamada et al.

(10) Patent No.: US 11,336,045 B2
(45) Date of Patent: May 17, 2022

(54) LGA SOCKET

(71) Applicant: Yamaichi Electronics Co., Ltd., Tokyo (JP)

(72) Inventors: Yoshiya Yamada, Tokyo (JP); Koji Kikuchi, Tokyo (JP); Toshiyasu Ito, Tokyo (JP); Yosuke Takai, Tokyo (JP)

(73) Assignee: Yamaichi Electronics Co., Ltd., Tokyo (JP)

(*) Notice: Subject to any disclaimer, the term of this patent is extended or adjusted under 35 U.S.C. 154(b) by 0 days.

(21) Appl. No.: 17/177,833

(22) Filed: Feb. 17, 2021

(65) Prior Publication Data

US 2021/0257765 A1 Aug. 19, 2021

(30) Foreign Application Priority Data

Feb. 17, 2020 (CN) .......................... 202010095570.9

(51) Int. Cl.
*H01R 13/24* (2006.01)
*H01R 12/58* (2011.01)
*H01R 13/504* (2006.01)
*H01R 33/74* (2006.01)
*H01R 13/03* (2006.01)
*H01R 12/71* (2011.01)

(52) U.S. Cl.
CPC .............. *H01R 13/24* (2013.01); *H01R 12/58* (2013.01); *H01R 12/714* (2013.01); *H01R 13/03* (2013.01); *H01R 13/504* (2013.01); *H01R 33/74* (2013.01)

(58) Field of Classification Search
CPC ...... H01R 23/722; H01R 9/096; H01R 13/24; H01R 13/504; H01R 13/03; H01R 12/58; H01R 12/714; H01R 33/74

USPC .......................................................... 439/66
See application file for complete search history.

(56) References Cited

U.S. PATENT DOCUMENTS

| 7,150,632 | B2 * | 12/2006 | Lee ..................... H01R 13/2435 |
| | | | 439/66 |
| 8,758,067 | B2 * | 6/2014 | Rathburn ............... H01R 12/57 |
| | | | 439/700 |
| 2008/0299801 | A1 * | 12/2008 | Jeon ...................... H05K 3/3426 |
| | | | 439/79 |
| 2011/0151688 | A1 * | 6/2011 | Beaman ............... H01R 12/585 |
| | | | 439/66 |

FOREIGN PATENT DOCUMENTS

JP 2018174017 A 11/2018

* cited by examiner

*Primary Examiner* — Gary F Paumen
(74) *Attorney, Agent, or Firm* — Hayes Soloway P.C.

(57) ABSTRACT

According to an embodiment, an LGA socket includes a center substrate, first and second insulator and a plurality of pairs of contacts. The center substrate is configured by a multi-layer structure including a ground layer and a plurality of through holes formed through the center substrate. The first insulator is arranged around the plurality of through holes on an upper surface of the center substrate. The second insulator is arranged around the plurality of through holes on a lower surface of the center substrate. The plurality of pairs of contacts are inserted into the through holes from an upper side and from a lower side of the through holes and are soldered via the through holes to be electrically connected to each other.

11 Claims, 21 Drawing Sheets

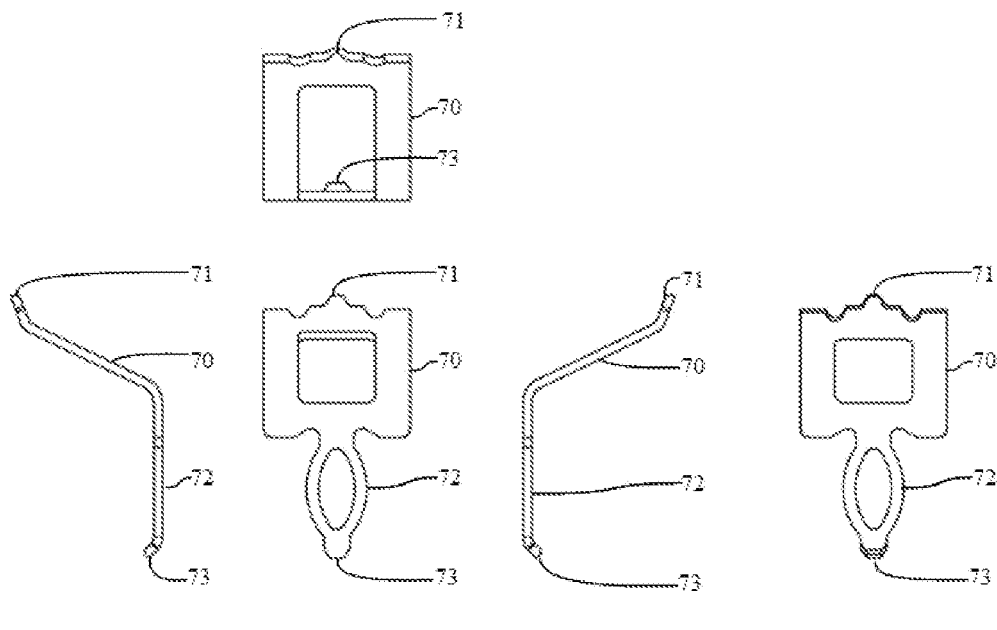
FIG.11A
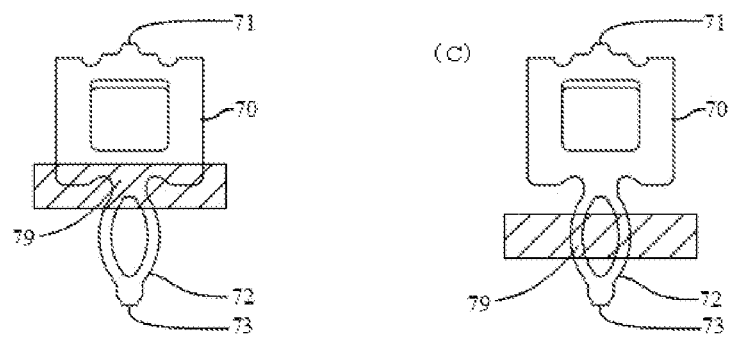
FIG.11B
FIG.11C

LGA SOCKET

CROSS-REFERENCE TO RELATED APPLICATION

This application claims the benefit of Chinese Patent application CN202010095570.9 filed on Feb. 17, 2020, the contents of which are incorporated herein by reference herein.

FIELD

The present invention relates to a socket which mediates high-speed transmission of signals between substrates.

BACKGROUND

Various technologies related to Land Grid Array (LGA) sockets for semiconductor packages have been proposed. For example, the socket disclosed in Japanese Patent Application Publication No. 2018-174017 (hereinafter referred to as "Patent Document 1") has a plurality of through holes formed through the front and back surfaces of a housing, and contacts press-fitted into the through holes and soldered.

The press-fitting portion of the contact of this socket pushed into the through hole has a width that is slightly greater than the inner diameter of the through hole, and the press-fitting portion, when press-fitted into the through hole, is pressed by the inner wall surface and elastically deformed, and thereby the position and posture of the contact in the through hole are temporarily fixed.

However, in conventional sockets of this type, the housing is formed of an insulating plate only. Therefore, there is a problem that it is difficult to suppress crosstalk that occurs during high-speed transmission of signals in a high frequency band.

The present invention is made in view of such a problem and one of objects thereof is to provide an LGA socket capable of reducing crosstalk.

SUMMARY

In accordance with an aspect of the present invention, there is provided an LGA socket including a center substrate, first and second insulator and a plurality of pairs of contacts. The center substrate is configured by a multi-layer structure including a ground layer and a plurality of through holes formed through the center substrate. The first insulator is arranged around the plurality of through holes on an upper surface of the center substrate. The second insulator is arranged around the plurality of through holes on a lower surface of the center substrate. The plurality of pairs of contacts are inserted into the through holes from an upper side and from a lower side of the through holes and are soldered via the through holes to be electrically connected to each other.

BRIEF DESCRIPTION OF DRAWINGS

FIGS. 11A-11C are hexagonal views of the contact of FIG. 10;

DETAILED DESCRIPTION

First Embodiment

Figure 1:
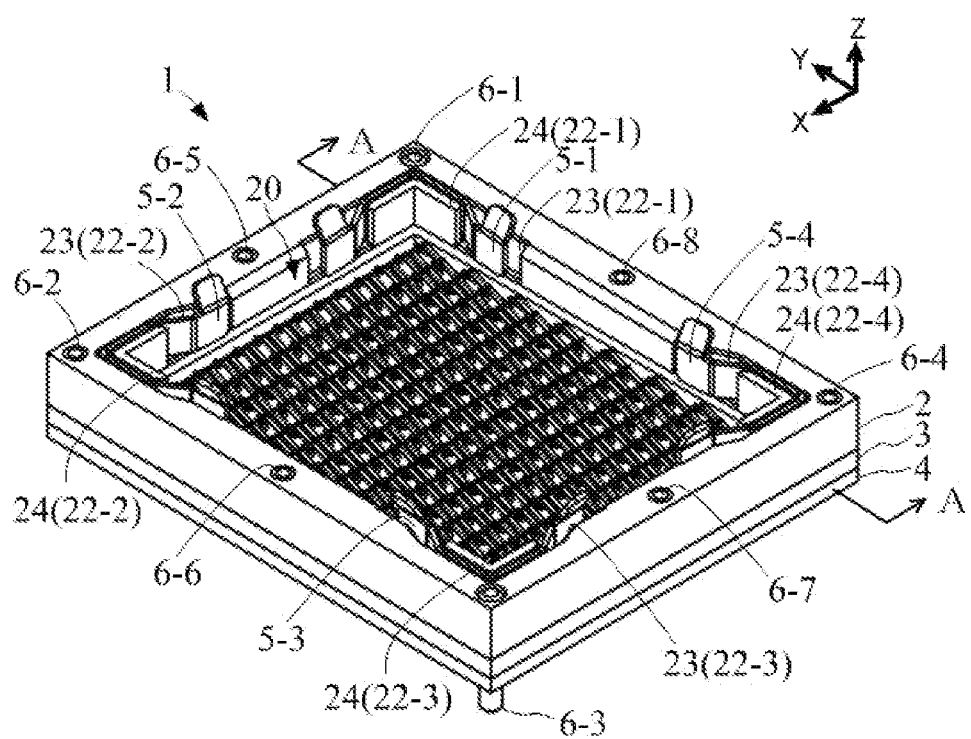
FIG. 1 is a perspective view of an LGA socket 1 according to a first embodiment of the present invention.

An LGA socket 1, which is a first embodiment of the present invention, will be described. The LGA socket 1 is mounted on a circuit board called a host board for use. The LGA socket 1 has a bottomed frontage 20. A communicating counterpart board called a package is fitted into the frontage 20 of the LGA socket 1. When the package is fitted into the frontage 20 of the LGA socket 1, a pad of the host board and a pad of the package are electrically connected via contacts 7$a$-$k$ (k=1 to 195) and 7$b$-$k$ (k=1 to 195) of the LGA socket 1, enabling high-speed transmission of signals between the host board and the package.

In the following description, a direction in which the package is fitted into the LGA socket 1 is appropriately referred to as a Z direction, a direction orthogonal to the Z direction is appropriately referred to as an X direction, and a direction orthogonal to both the Z direction and the X direction is appropriately referred to as a Y direction. Further, a +Z side, which is a side of the package in the Z direction, may be referred to as an upper side, and a −Z side, which is a side of the LGA socket 1, may be referred to as a lower side.

The LGA socket 1 includes a center substrate 3, a first insulator 2, a second insulator 4, metal springs 5-$j$ (j=1 to 4), pins 6-$m$ (m=1 to 8), and contacts 7$a$-$k$ (k=1 to 195) and 7$b$-$k$ (k=1 to 195).

Figure 2A:
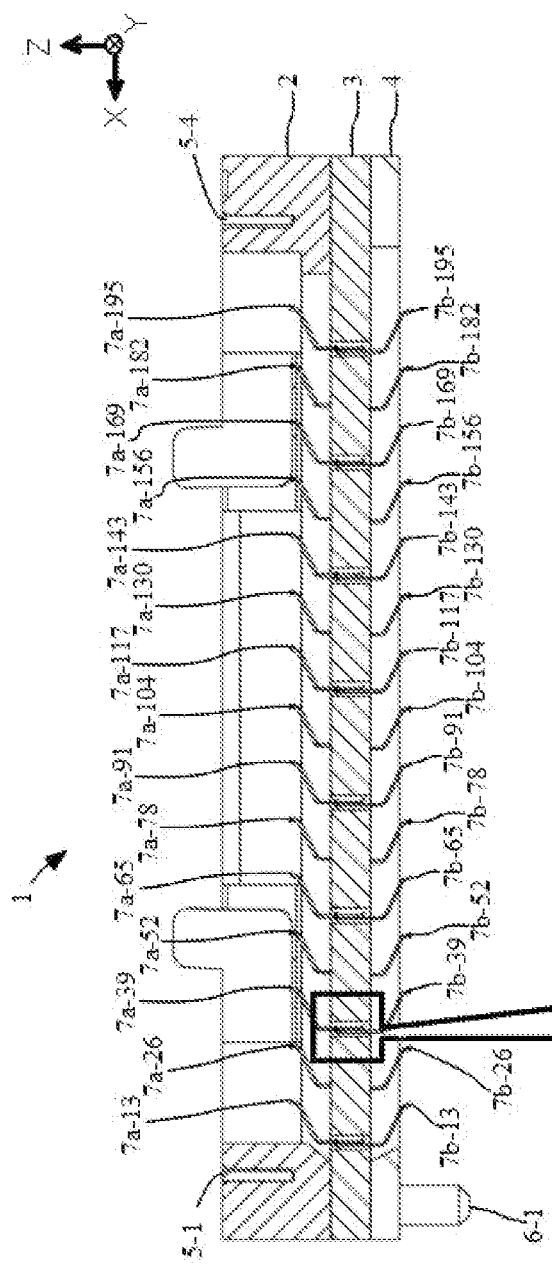
FIG. 2A is a cross-sectional view taken along line A-A of FIG. 1.
Figure 2B:
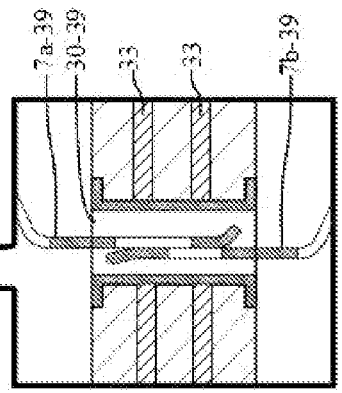
FIG. 2B is a partially enlarged view of FIG. 2A.
Figures 3A, 3B:
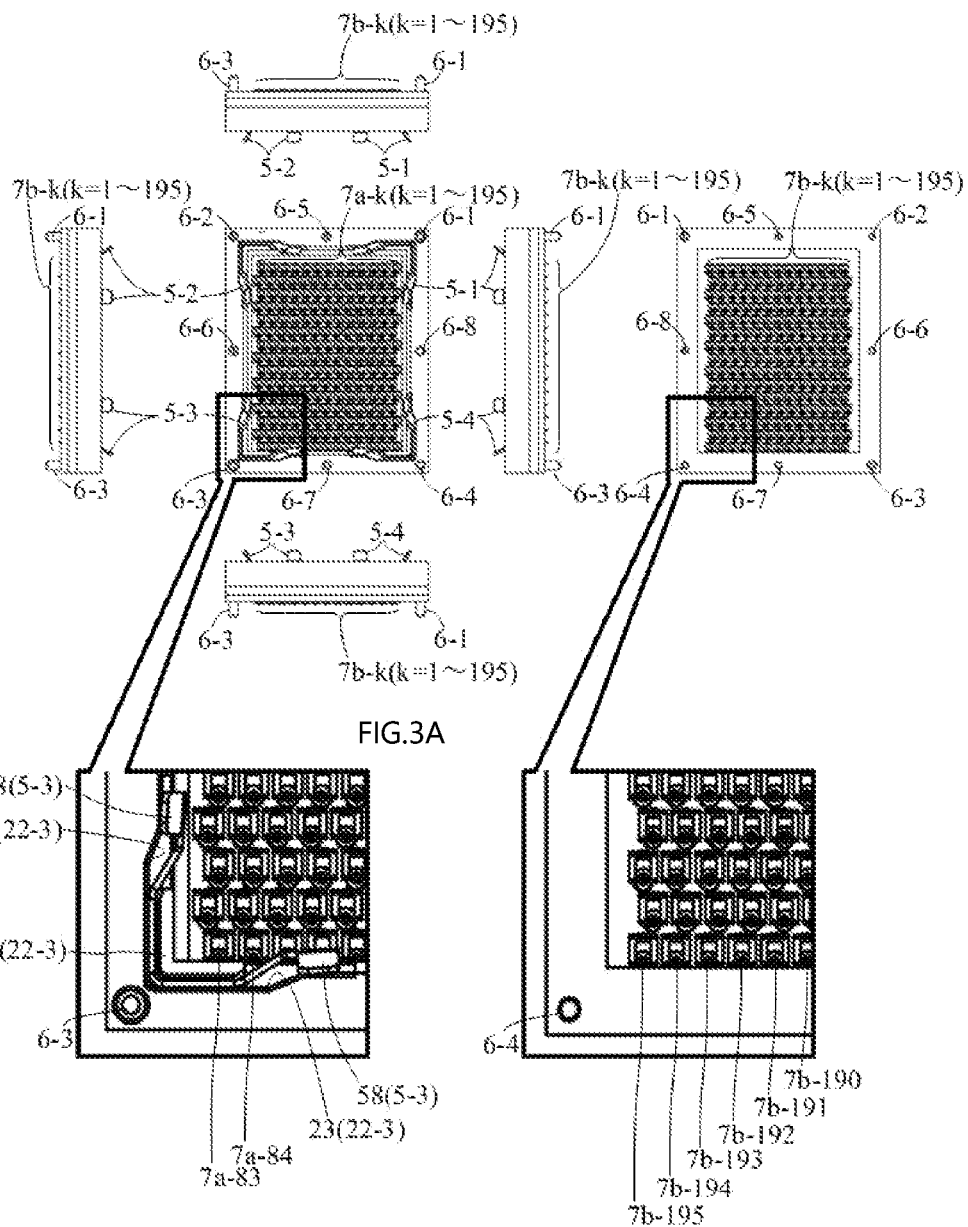
FIG. 3A is a six-side view of the LGA socket 1 of FIG. 1.
FIG. 3B is a partially enlarged view of FIG. 3A.
Figure 4:
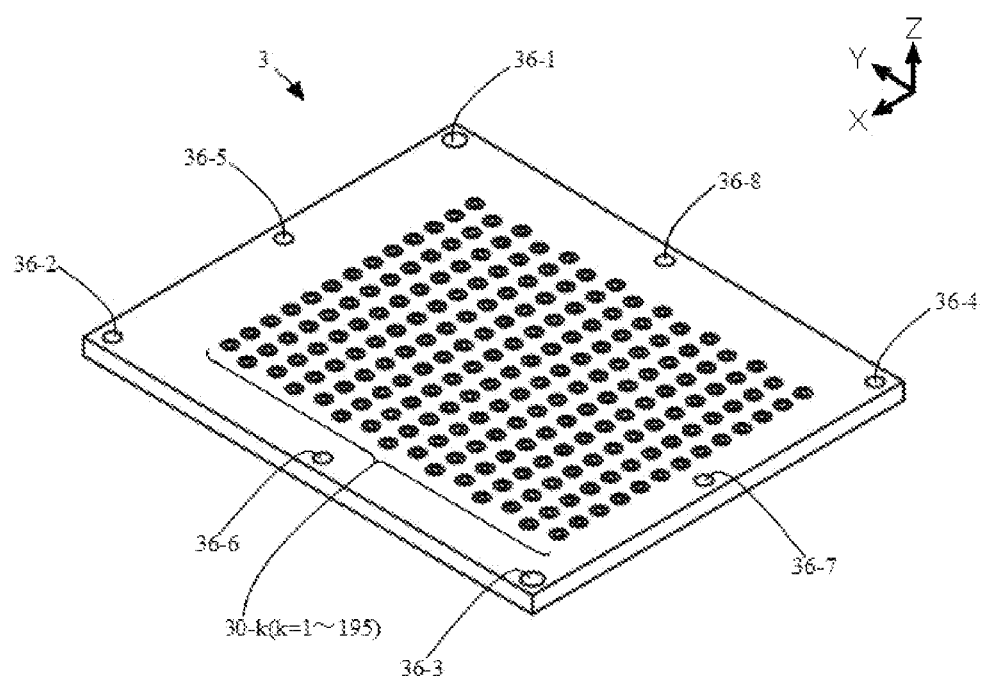
FIG. 4 is a perspective view of a center substrate 3 of FIG. 1.
Figure 5:
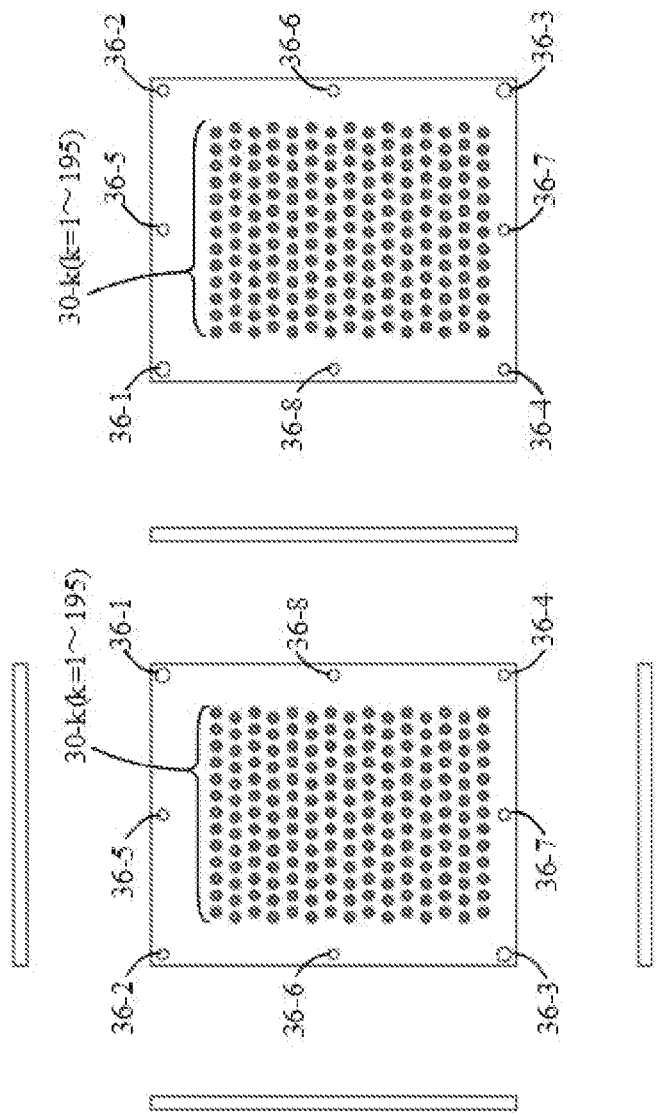
FIG. 5 is a six-side view of the center substrate 3 of FIG. 4.

As shown in FIGS. 2B, 4 and 5, the center substrate 3 is a multilayer substrate having a multi-layer structure including a ground layer 33, a power supply layer, a signal layer, and the like. The center substrate 3 has a thin rectangular plate shape. Screw holes 36-$m$ ($m$=1 to 8) are provided on the inner side of the four corners of the center substrate 3 and on the inner side of the centers of the four sides. In a central rectangular region of the center substrate 3, 195 through holes 30-$k$ ($k$=1 to 195) for soldering 195 pairs of contacts 7$a$-$k$ ($k$=1 to 195) and 7$b$-$k$ ($k$=1 to 195) are provided. The through holes 30-$k$ ($k$=1 to 195) form a hound's-tooth check-like pattern with 15 rows and 13 columns. The way of soldering the contacts 7$a$-$k$ ($k$=1 to 195) and 7$b$-$k$ ($k$=1 to 195) to the through holes 30-$k$ ($k$=1 to 195) will be described in detail later.

Figure 6:
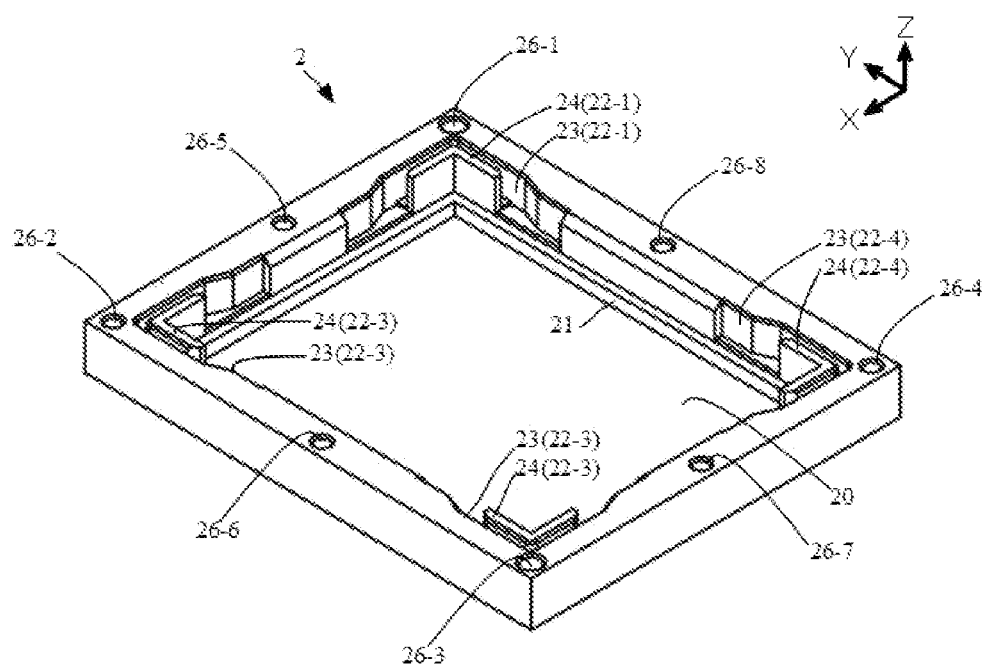
FIG. 6 is a perspective view of a first insulator 2 of FIG. 1.
Figure 7:
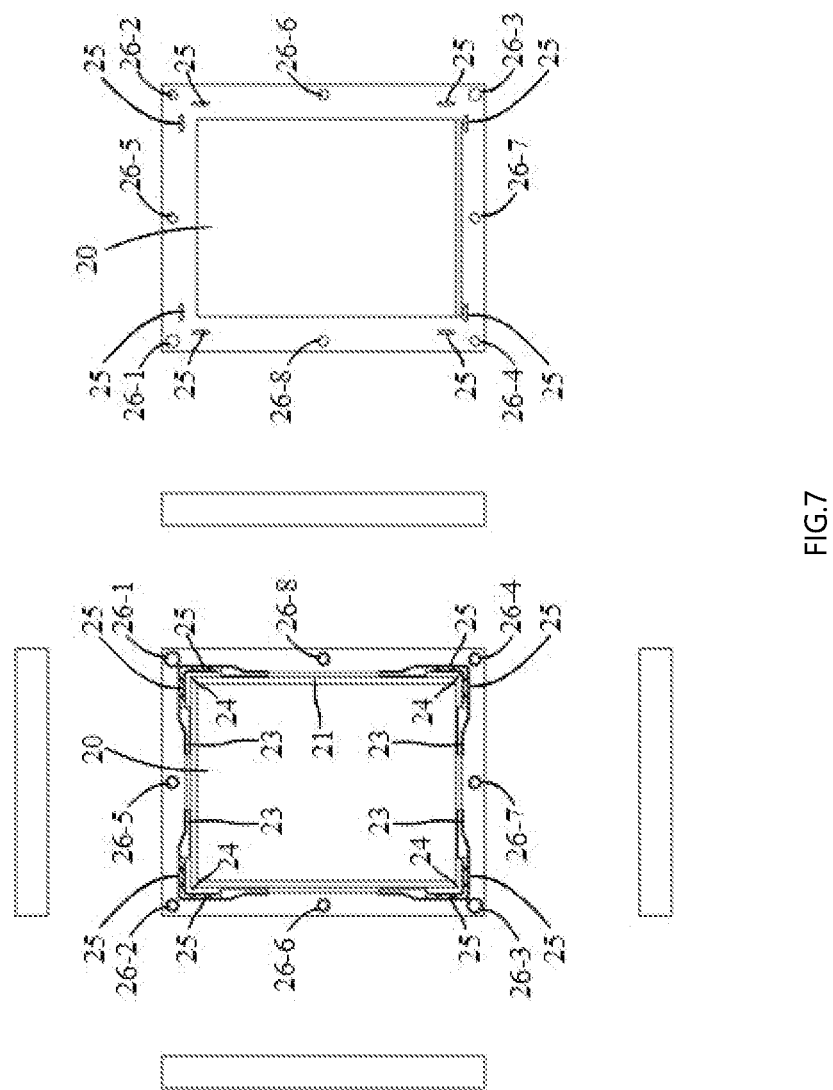
FIG. 7 is a six-side view of the first insulator 2 of FIG. 6.

As shown in FIGS. 6 and 7, the first insulator 2 has a square frame shape that is thicker than the center substrate 3. The external dimensions of the first insulator 2 are substantially the same as those of the center substrate 3. Screw holes 26-$m$ ($m$=1 to 8) are provided on the inner side of the four corners of the first insulator 2 and on the inner side of the centers of the four sides. In the center of the first insulator 2, there is a frontage 20 corresponding to the region of the center substrate 3 including the through holes 30-$k$ ($k$=1 to 195). Lower portions of inner wall surfaces of the first insulator 2 surrounding the frontage 20 project inward as step portions 21.

Holding portions 22-$j$ ($j$=1 to 4) for holding the metal springs 5-$j$ ($j$=1 to 4) are provided above the four corners of the inner wall surface of the first insulator 2. Each of the holding portions 22-$j$ ($j$=1 to 4) is provided with a recessed portion 23 in which a substantially L-shaped portion including one of the four corners of the inner wall surface is recessed outward, and provided with a support wall 24 in a substantially L shape smaller than the recessed portion 23 on the inner side of the recessed portion 23. The wall surface of the recessed portion 23 facing the support wall 24 across a gap extends from the corner portion in the X and Y directions, is slightly inclined inward from a position slightly outside an end of the support wall 24, and extends along the X and Y directions again from the position where the wall surface is inclined and extends.

As shown in FIG. 7, an elongated hole 25 is formed in the gap between the support wall 24 and the wall surface of the recessed portion 23 in each of the holding portions 22-$j$ ($j$=1 to 4). The elongated hole 25 has a trapezoidal shape. Peripheral walls corresponding to the short base and the long base of the trapezoid of the elongated hole 25 are on the inner and outer sides, respectively. The peripheral wall of the elongated hole 25 on the outer side is flush with the wall surface of the recessed portion 23.

Figure 8:
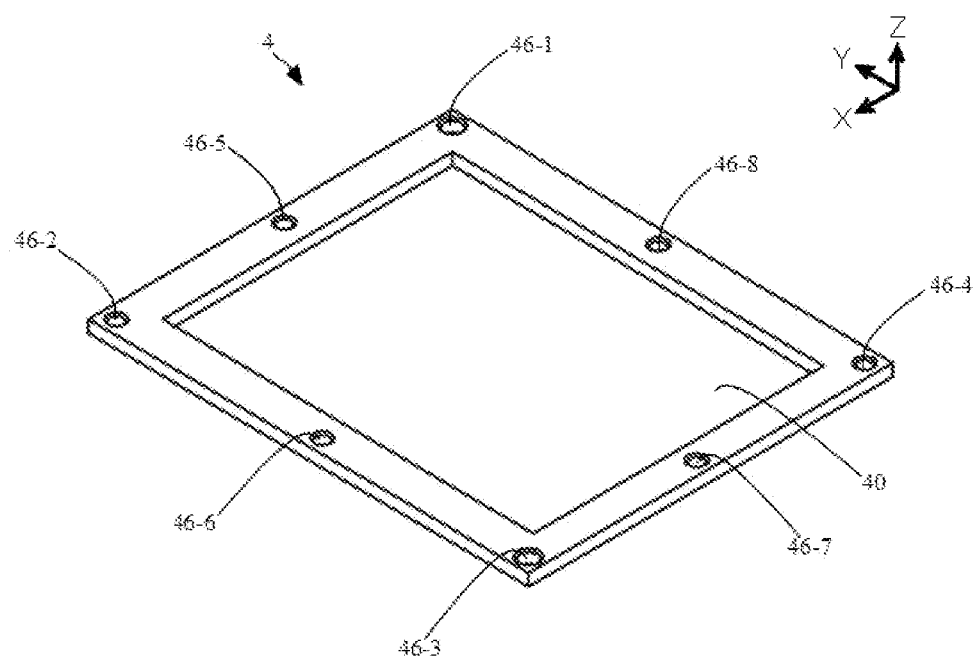
FIG. 8 is a perspective view of a second insulator 4 of FIG. 1.
Figure 9:
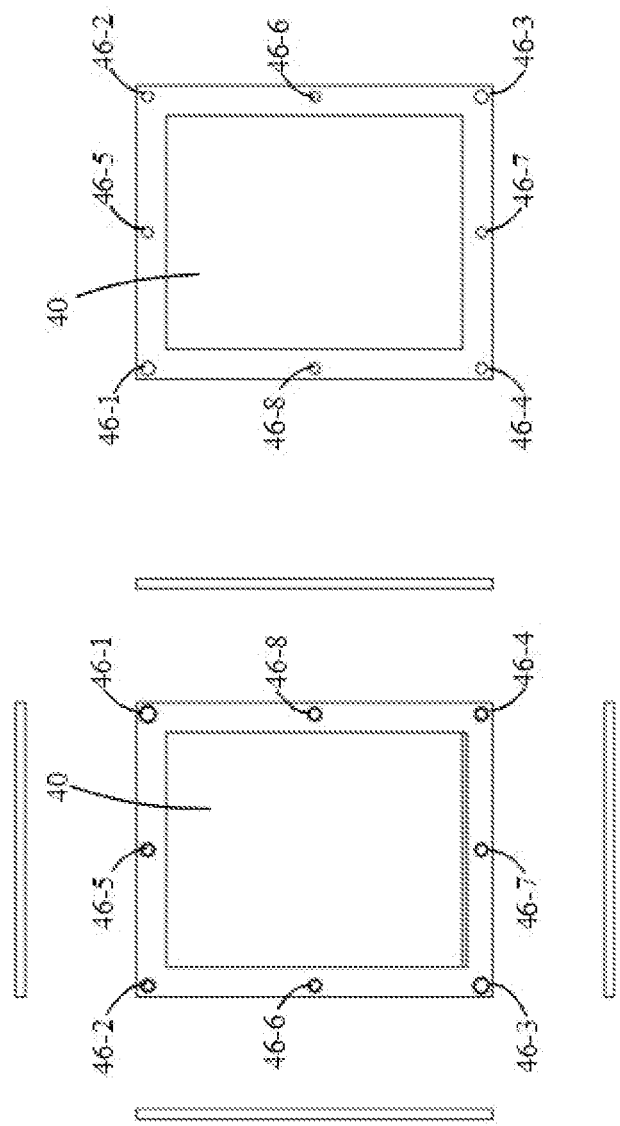
FIG. 9 is a six-side view of the second insulator 4 of FIG. 8.

As shown in FIGS. 8 and 9, the second insulator 4 has a square frame shape having substantially the same thickness as that of the center substrate 3. The external dimensions of the second insulator 4 are substantially the same as those of the center substrate 3 and the first insulator 2. Screw holes 46-$m$ ($m$=1 to 8) are provided on the inner side of the four corners of the second insulator 4 and on the inner side of the centers of the four sides. In the center of the second insulator 4, there is a frontage 40 corresponding to a region of the center substrate 3 including the through holes 30-$k$ ($k$=1 to 195). The size of the frontage 40 is the same as that of the frontage 20 of the first insulator 2.

The center substrate 3, the first insulator 2, and the second insulator 4 are laminated in such a manner that the center substrate 3 is placed on the second insulator 4 and the first insulator 2 is placed on the center substrate 3, and are integrated by screwing the pins 6-$m$ ($m$=1 to 8) into the screw holes 26-$m$ ($m$=1 to 8), 36-$m$ ($m$=1 to 8), and 46-$m$ ($m$=1 to 8).

Here, among the pins 6-$m$ ($m$=1 to 8), the pins 6-1 screwed into the screw holes 26-1, 36-1 and 46-1 and the pins 6-3 screwed into the screw holes 26-3, 36-3, and 46-3 have a length greater than a vertical width of the laminated body of the first insulator 2, the center substrate 3, and the second insulator 4. Portions of the pins 6-1 and 6-3 on the lower side protrude downward from the second insulator 4. No screw groove is provided at the periphery of the portions of pins 6-1 and 6-3 protruding downward. The portions of pins 6-1 and 6-3 protruding downward are fitted into positioning holes of the host board and are used for positioning the LGA socket 1 on the mounting surface of the host board.

The contacts 7$a$-$k$ ($k$=1 to 195) and 7$b$-$k$ ($k$=1 to 195) are terminals made of beryllium copper. The contacts 7$a$-$k$ ($k$=1 to 195) and 7$b$-$k$ ($k$=1 to 195) are made of beryllium copper as a base material, the base material is nickel-plated on the surface thereof, and the nickel-plated surface is gold-plated. Each of the contacts 7$a$-$k$ ($k$=1 to 195) and 7$b$-$k$ ($k$=1 to 195) includes a main body portion 70 bent at an obtuse angle, an insertion portion 72 that protrudes from an end of the main body portion 70 and is inserted into the through hole 30-$k$, and a contact portion 71 that protrudes from an end of the main body portion 70 opposite to the insertion portion 72 and comes into contact with a pad of a substrate to be mounted.

Figure 10:
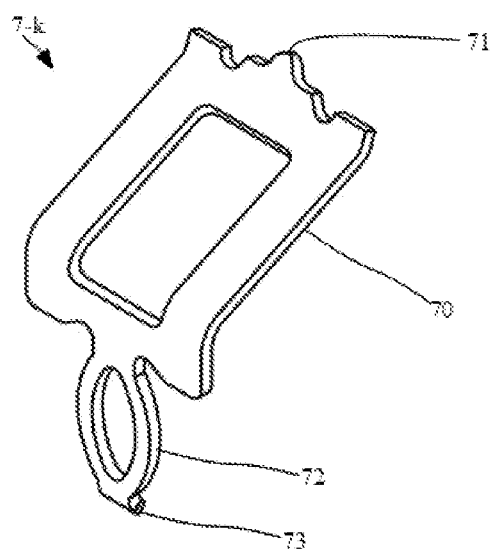
FIG. 10 is a perspective view of a contact of press-fit type 1.
Figure 12:
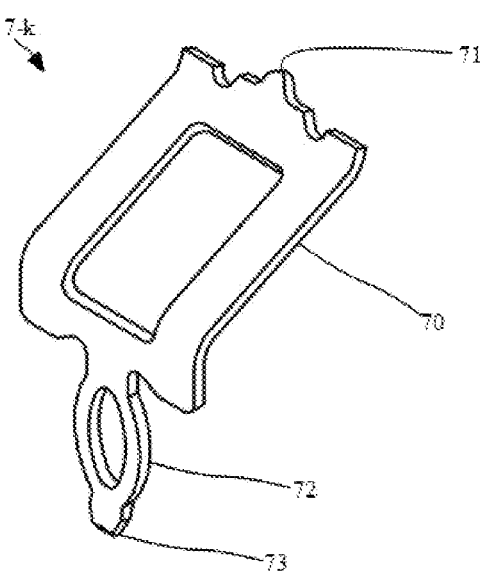
FIG. 12 is a perspective view of a contact of press-fit type 2.
Figure 13:
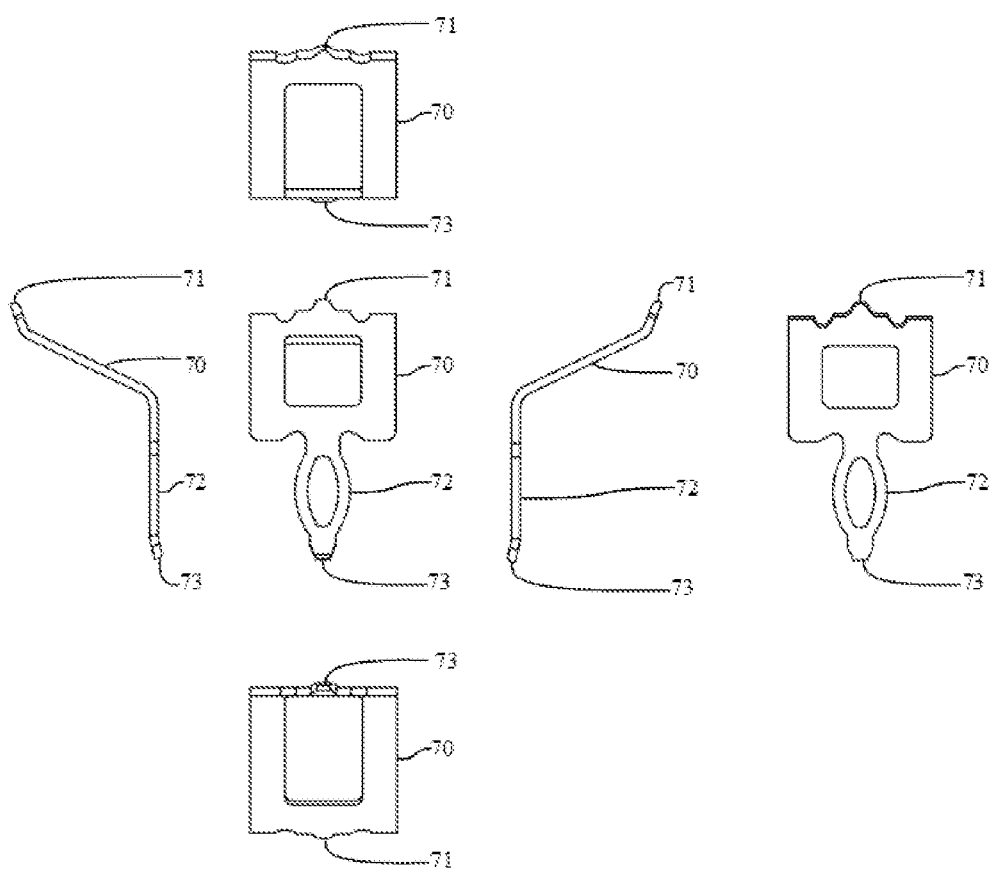
FIG. 13 is a six-side view of the contact of FIG. 12.
Figure 14:
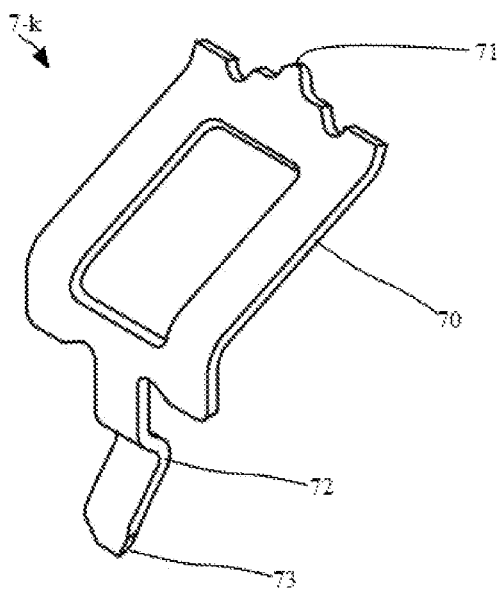
FIG. 14 is a perspective view of a contact of spring type 1.
Figure 15:
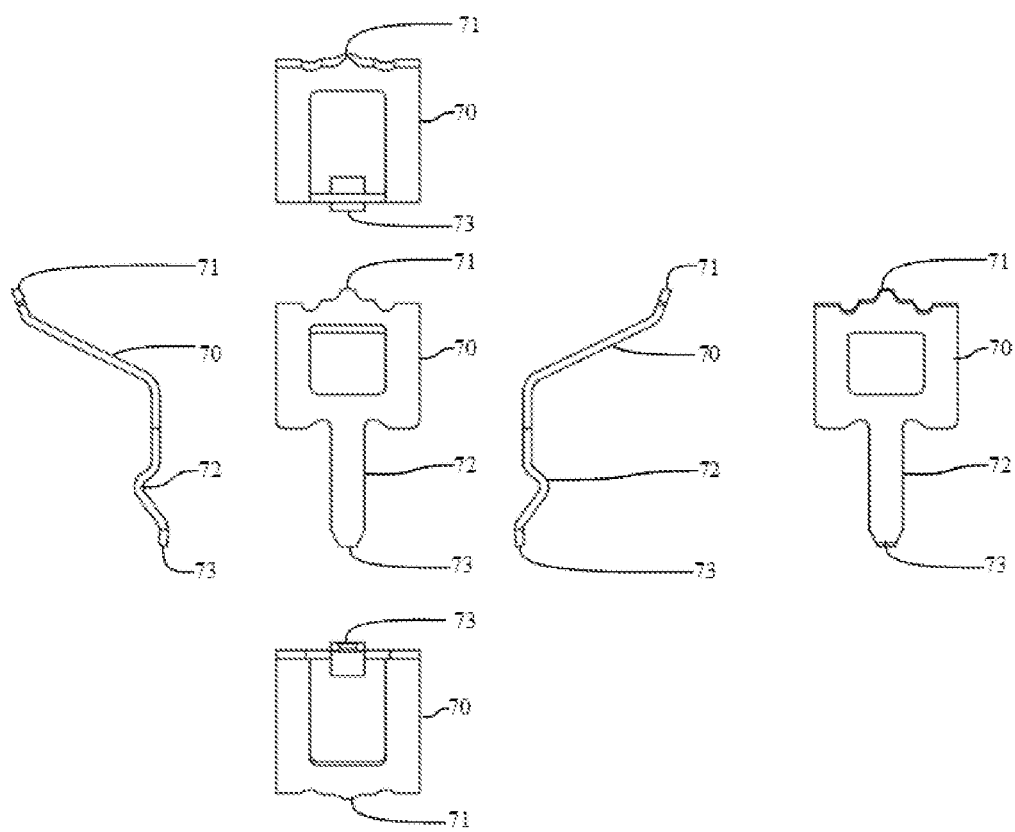
FIG. 15 is a six-side view of the contact of FIG. 14.
Figure 16:
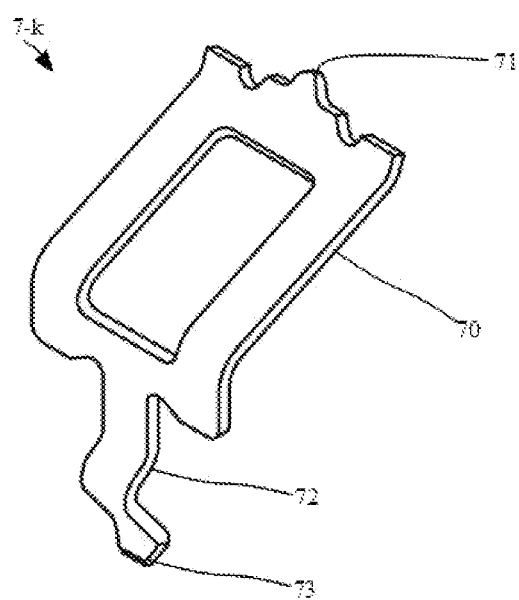
FIG. 16 is a perspective view of a contact of spring type 2.
Figure 17:
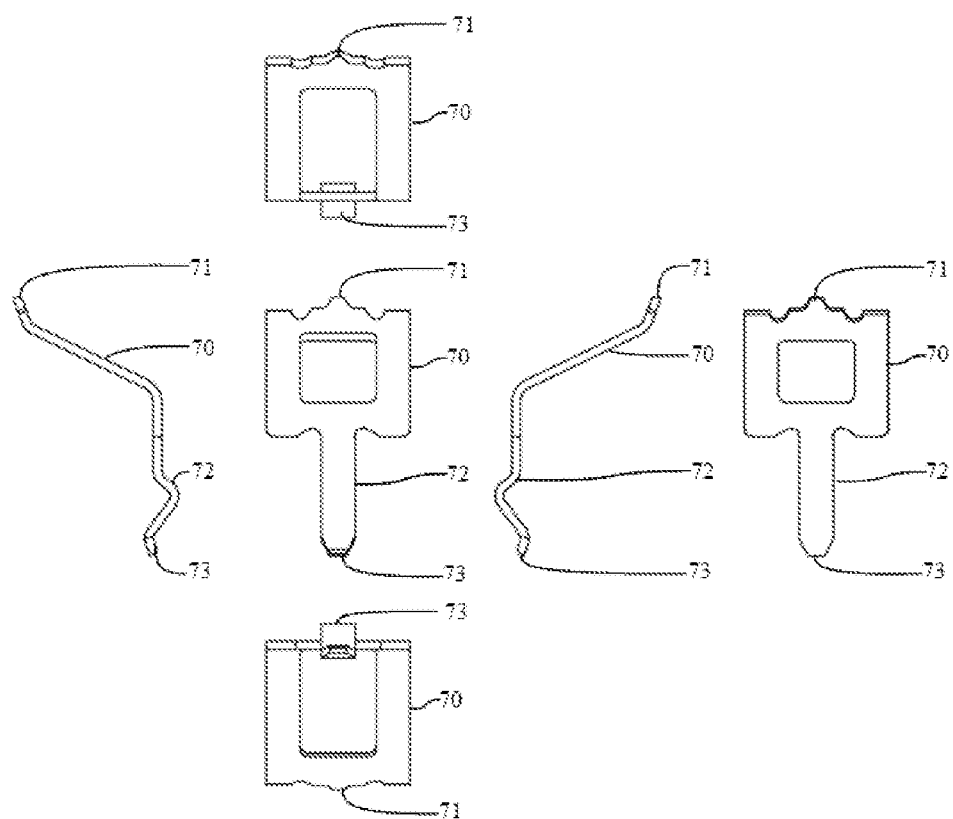
FIG. 17 is a six-side view of the contact of FIG. 16.

Here, the contacts include four types, namely a press-fit type 1 shown in FIGS. 10 and 11, a press-fit type 2 shown in FIGS. 12 and 13, a spring type 1 shown in FIGS. 14 and 15, and a spring type 2 shown in FIGS. 16 and 17. The pair of contacts 7$a$-$k$ and 7$b$-$k$ soldered to the through holes 30-$k$ is configured by some combination of the four types. The structure of each type of contact is as follows.

a1. Press-Fit Type 1

As shown in FIGS. 10 and 11A-11C, in this type of contact, a tip of a base end portion of the insertion portion 72 connected to the main body portion 70 has an elliptical ring shape, and the tip has a tapered tip portion 73. The tip portion 73 is bent toward the same side as the side of the contact portion 71.

In addition, a nickel barrier 79 is formed on this type of contact. The nickel barrier 79 is obtained by peeling off the gold plate of a part of the contact on the side of the insertion portion 72 relative to the bent portion of the main body portion 70 to expose nickel under the gold plate. By providing the nickel barrier 79, the insertion portions 72 of the two contacts 7$a$-$k$ and 7$b$-$k$ paired from the upper side and the lower side of the through hole 30-$k$ are inserted, and the through hole 30-$k$ is filled with solder cream. Then, when the reflow is applied, the situation in which the solder spreads to the bent portion of the main body portion 70 and elasticity of the bent portion is impaired is avoided. The position where nickel is exposed as the nickel barrier 79 is, as shown in FIG. 11B, at the boundary between the main body portion 70 and the insertion portion 72, or as shown in FIG. 11C, at the central portion of the insertion portion 72 in a direction in which the insertion portion 72 protrudes from the main body portion 70.

b1. Press-Fit Type 2

As shown in FIGS. 12 and 13, a tip of a base end portion of the insertion portion 72 connected to the main body portion 70 has an elliptical ring shape, and the tip has a tapered tip portion 73. However, in this type of contact, the tip portion 73 is bent toward the opposite side of the contact portion 71. Also in this type of contact, a nickel barrier 79 is formed at the boundary between the main body portion 70 and the insertion portion 72, or at the central portion of the insertion portion 72 in the protruding direction.

c1. Spring Type 1

As shown in FIGS. 14 and 15, in this type of contact, an extending portion of a tip of a base end portion of the insertion portion 72 connected to the main body portion 70, when viewed from one side, is bent at an obtuse angle toward one side and extends, and bent back toward the other side and extends, and the tip has a tapered tip portion 73. The tip portion 73 is bent toward the same side as the side of the contact portion 71. Also in this type of contact, a nickel barrier 79 is formed at the boundary between the main body portion 70 and the insertion portion 72, or at the central portion of the insertion portion 72 in the protruding direction.

d1. Spring Type 2

As shown in FIGS. 16 and 17, in this type of contact as well, an extending portion of a tip of a base end portion of the insertion portion 72 connected to the main body portion 70, when viewed from one side, is bent at an obtuse angle toward one side and extends, and bent back toward the other side and extends, and the tip has a tapered tip portion 73. However, in this type of contact, the tip portion 73 is bent toward the opposite side of the contact portion 71. Also in this type of contact, a nickel barrier 79 is formed at the boundary between the main body portion 70 and the insertion portion 72, or at the central portion of the insertion portion 72 in the protruding direction.

Here, FIG. 2B shows a cross section around the through holes 30-39 when the upper contact 7a-39 is the press-fit type 1 and the lower contact 7b-39 is the press-fit type 2. In this case, the procedure from the insertion of the contacts 7a-k (k=1 to 195) and 7b-k (k=1 to 195) into the through holes 30-k (k=1 to 195) to the reflow is as follows. First, the insertion portions 72 of the contacts 7a-k of the press-fit type 1 are pushed into the through holes 30-k from above. The insertion portions 72 of the press-fit type 1 have an elliptical ring shape, and the width of the ellipse in the minor axis direction is larger than the inner circumference of the through holes 30-k. Therefore, when the insertion portions 72 of the contacts 7a-k of the press-fit type 1 are pushed into the through holes 30-k, the insertion portions 72 are pushed to a position where they oppose the Y direction with respect to the center on the inner circumference of the through holes 30-k and distorted inward. When the insertion portions 72 are pushed in as such, the insertion portions 72 move to the center positions of the through holes 30-k in the Z direction, are supported by the inner circumference of the through holes 30-k, and stops at the center position.

Next, the insertion portions 72 of the contacts 7b-k of the press-fit type 2 are pushed into the through holes 30-k from below. The tip portions 73 of the contacts 7b-k come into contact with the tips of the contacts 7a-k, which are the press-fit type 1, and are guided by the tip portions 73 to move to the +X side in the through holes 30-k. When the insertion portions 72 of the contacts 7b-k of the press-fit type 2 are pushed in as such, the insertion portions 72 move to the center positions of the through holes in the Z direction while contacting the insertion portions 72 of the contacts 7a-k, are supported by the inner circumference of the through holes 30-k and the insertion portions 72 of the contacts 7a-k, and stops at the center position. After performing the above operations for all of the through holes 30-k (k=1 to 195), the solder cream is injected into the through holes 30-k (k=1 to 195) by a dispenser and reflowed.

The combination of the types of the pair of contacts 7a-k and 7b-k to be soldered to the through holes 30-k is not limited thereto. For example, the type of the contacts 7a-k inserted into the through holes 30-k from above may be the spring type 1, and the type of the contacts 7b-k inserted from below may be the spring type 2. For both the spring type 1 and the spring type 2, the insertion portion 72 is bent at an obtuse angle toward one side and extends, and then bent back toward the other side and extends. Therefore, the contacts 7a-k of the spring type 1 and the contacts 7b-k of the spring type 2 are pushed into the through holes 30-k so that the bent portions of the insertion portions 72 of each type are directed to the +X side and the −X side, and consequently, the bent portion of the insertion portion 72 of each of the two contacts 7a-k and 7b-k is pushed to a position where it opposes the X direction with respect to the center of the through hole 30-k, and the insertion portion 72 is distorted so that the bent portion extends. When the insertion portion 72 of each of the two contacts 7a-k and 7b-k is pushed in as such, the insertion portion 72 moves to the center position of the through hole 30-k in the Z direction, is supported by the inner circumference of the through hole 30-k, and stops at the center position.

Further, the type of the contact 7a-k inserted into the through hole 30-k from above may be either the press-fit type 1 or press-fit type 2, and the type of contact 7b-k inserted from below may be either the spring type 1 or spring type 2. In this case, the insertion portion 72 of the contact 7a-k of the press-fit type 1 or the press-fit type 2 is firstly inserted into the through hole 30-k, and the insertion portion 72 of the contact 7b-k of the spring type 1 or the spring type 2 is inserted later into the through hole 30-k.

Figure 18:
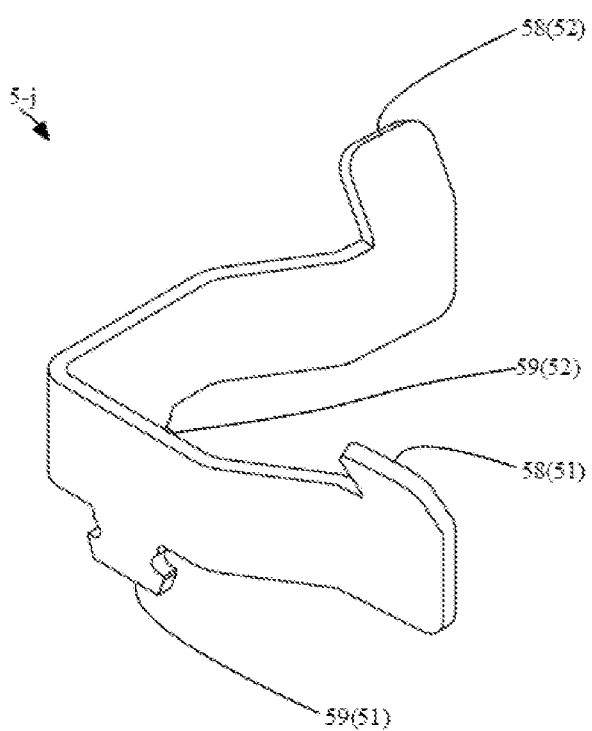
FIG. 18 is a perspective view of a metal spring 5-$j$ of FIG. 1.
Figure 19:
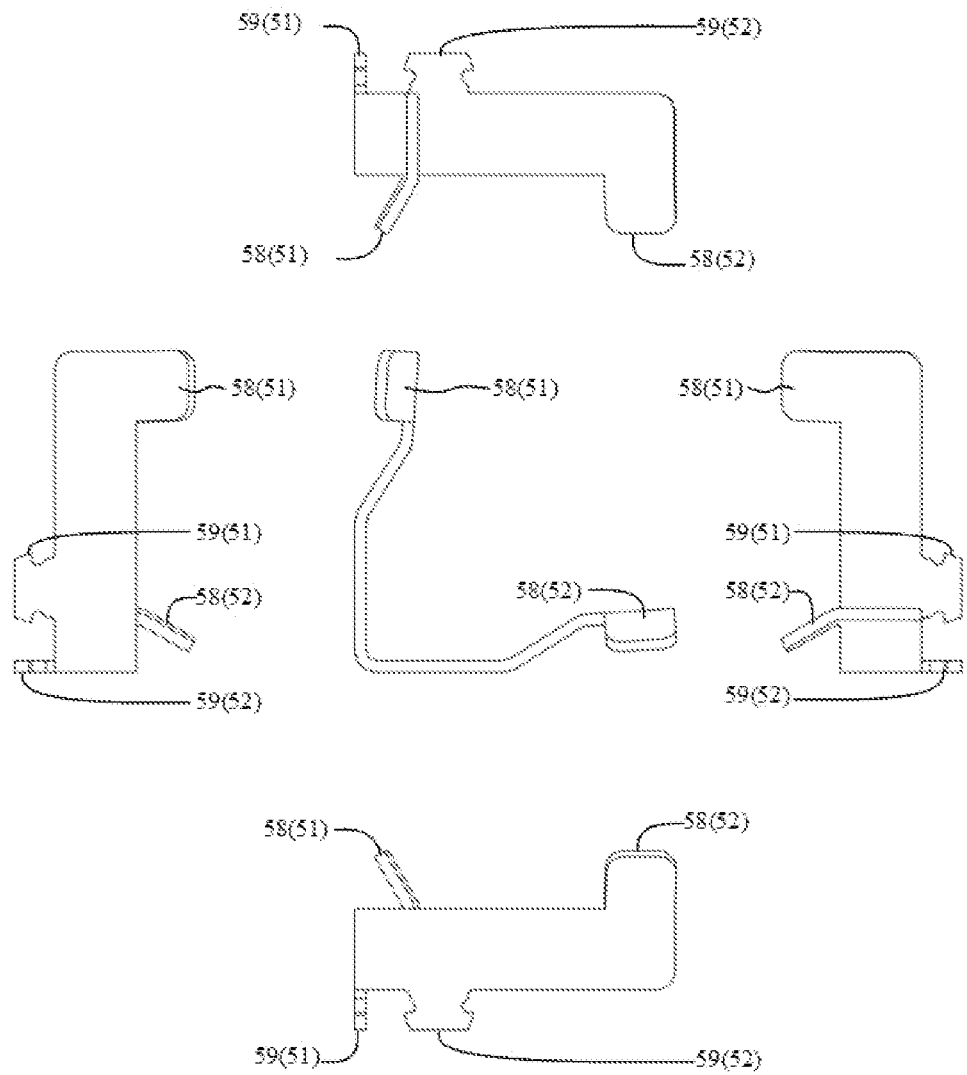
FIG. 19 is a six-side view of the metal spring 5-$j$ of FIG. 18.

As shown in FIGS. 18 and 19, the metal spring 5-j is a single metal plate that is bent so as to form a substantially V shape. The metal spring 5-j includes a first plate portion 51 and a second plate portion 52. The first plate portion 51 and the second plate portion 52 are mirror-symmetrical. The first plate portion 51 and the second plate portion 52 are bent inward on the way from a base end to a tip of the plate portion. The portions of the first plate portion 51 and the second plate portion 52 that are bent inward are more steeply inclined than the portion of the wall surface of the recessed portion 23 of the holding portion 22-j (j=1 to 4) extending so as to be inclined inward.

An expansion portion 58 is provided on one side of the first plate portion 51 and the second plate portion 52 on the tip side. The expansion portions 58 of the first plate portion 51 and the second plate portion 52 extend in a direction inclined outward with respect to the plate surfaces of the plate portions. Protrusions 59 are provided on the base end side of the first plate 51 and the second plate 52 and on the side opposite to the side on which the expansion portions 58 are provided. The protrusions 59 are flush with the plate surfaces of the first plate portion 51 and the second plate portion 52. The metal spring 5-j is housed in the holding portion 22-j so that the expansion portions 58 is oriented upward from the holding portion 22-j and the protrusions 59 are fitted into the elongated holes 25.

The metal springs 5-j (j=1 to 4) held by the holding portions 22-j (j=1 to 4) play a role in helping adjust the fitting position when the package is fitted to the frontage 20 of the LGA socket 1. When the package is brought close to the frontage 20 of the LGA socket 1 and the lower edge of the package is brought into contact with the expansion portions 58 of the metal springs 5-j (j=1 to 4), the package is guided to the center of the frontage 20 by the expansion portions 58 of the metal springs 5-j (j=1 to 4). When the package is pushed in as such, the package pushes each of the metal springs 5-j (j=1 to 4) outward and is fitted into the frontage 20, and the pad of the package comes into contact with the contact portions 71 of the contacts 7a-k (k=1 to 195)

exposed above the through holes 30-$k$ ($k$=1 to 195). A repulsive force of an outward force applied by the package is generated on the metal springs 5-$j$ ($j$=1 to 4). Therefore, an inward force is applied to the package from the metal springs 5-$j$ ($j$=1 to 4), and the package is held at the center of the frontage 20.

The details of the configuration of this embodiment are described above. The LGA socket 1 of this embodiment includes a center substrate 3 having a multi-layer structure including a ground layer 33 and having a plurality of through holes 30-$k$ ($k$=1 to 195) formed therethrough, a first insulator 2 arranged around the plurality of through holes 30-$k$ ($k$=1 to 195) on an upper surface of the center substrate 3, a second insulator 4 arranged around the plurality of through holes 30-$k$ ($k$=1 to 195) on a lower surface of the center substrate 3, and a plurality of pairs of contacts 7$a$-$k$ ($k$=1 to 195) and 7$b$-$k$ ($k$=1 to 195) that are inserted into the through holes 30-$k$ ($k$=1 to 195) from an upper side and a lower side of the through holes 30-$k$ ($k$=1 to 195) and soldered via the through holes 30-$k$ ($k$=1 to 195) to be electrically connected to each other. The center substrate 3 of the LGA socket 1 has a ground layer 33, and deterioration of crosstalk is suppressed by the ground layer 33. Therefore, according to this embodiment, it is possible to provide the LGA socket 1 capable of reducing crosstalk.

Second Embodiment

Figure 20:
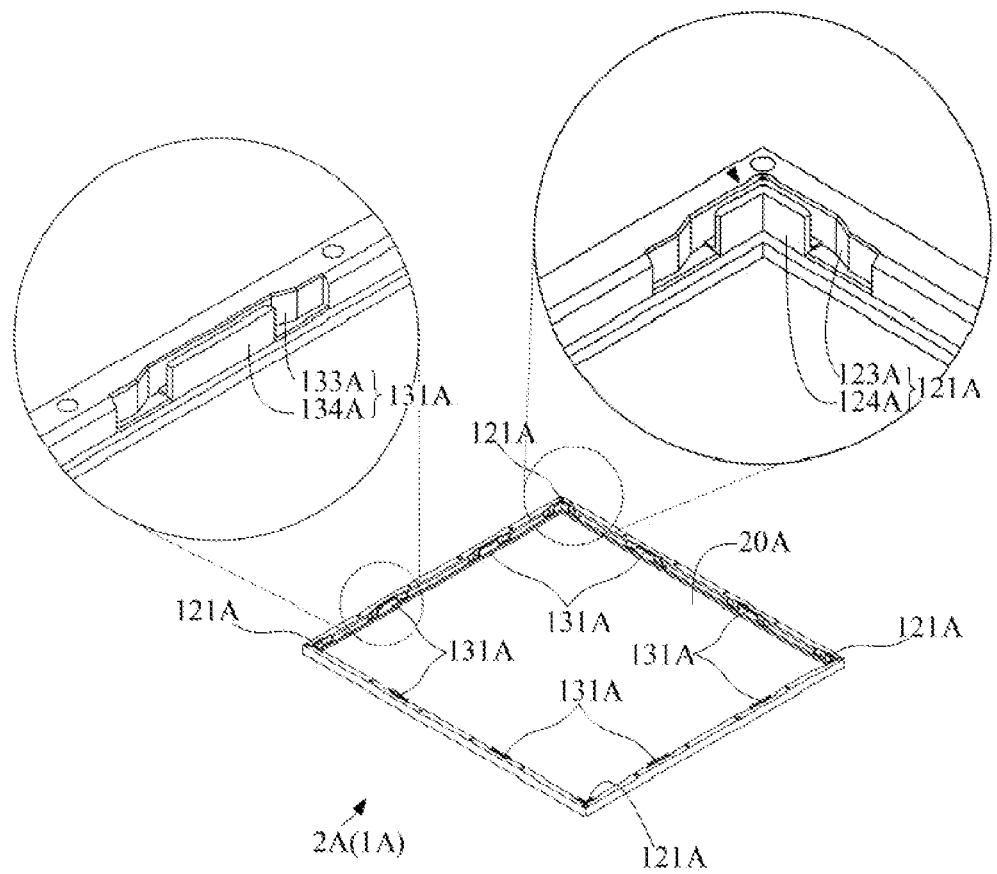
FIG. 20 is a perspective view of an LGA socket 1A according to a second embodiment of the present invention.

Next, the LGA socket 1A, which is a second embodiment of the present invention, will be described. FIG. 20 is a perspective view of the first insulator 2A of the LGA socket 1A. This LGA socket 1A is a large type socket in which the number of contacts 7$a$-$k$ and 7$b$-$k$ is 5000 or 10000.

The first insulator 2A has a square frame shape with a frontage 20A. The first pressing portions are provided at the four corners of the square frame of the first insulator 2A. The first pressing portion applies an inward force to a member fitted to the frontage 20A. Further, two second pressing portions are provided on each side of the four sides of the first insulator 2A. The second pressing portion applies an inward force to a member to be fitted to the frontage 20A.

More specifically, the first pressing portion includes a first spring member as a pressing means and a first accommodation portion for accommodating the first spring member. The first spring member may be a single metal plate bent so as to form a substantially V shape. The first spring member is held in a first support groove 121A formed by a first recessed portion 123A in which a part of the inner wall surface of the square frame including corners is recessed from inside to outside, and a first support wall 124A erected along the inner wall surface.

The second pressing portion includes a second spring member as a pressing means and a second accommodation portion for accommodating the second spring member. The second spring member may be a single metal plate with both ends thereof being bent. The second spring member is held in a second support groove 131A formed by a second recessed portion 133A in which a part of the inner wall surface forming the sides of the square frame is recessed from inside to outside, and a second support wall 134A erected along the inner wall surface. The same effect as that of the first embodiment can be obtained by this embodiment as well.

Although the first and second embodiments of the present invention have been described above, the following modifications may be made to these embodiments.

(1) In the first embodiment, the pairs of contacts 7$a$-$k$ ($k$=1 to 195) and 7$b$-$k$ ($k$=1 to 195) may be arranged in a matrix rather than in a hound's-tooth check-like pattern.

Figure 21:
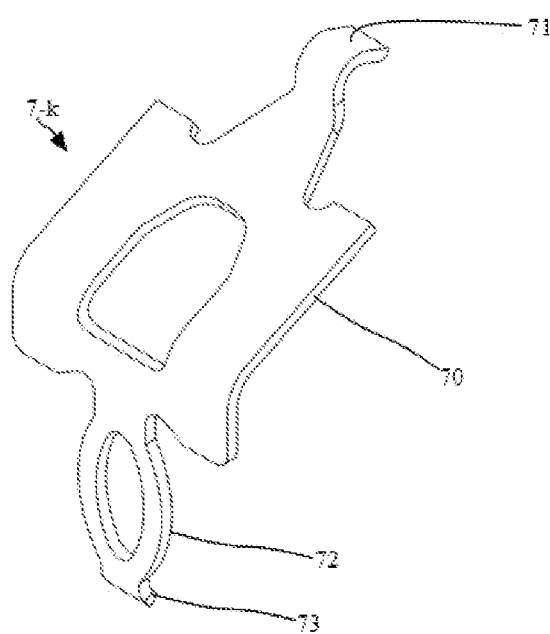
FIG. 21 is a perspective view of a contact according to a modified example of the present invention.

(2) In the first embodiment, as shown in FIG. 21, the tip of the contact portion 71 of the press-fit type 1 may have a curved structure curled in the same direction as the bending direction of the tip portion 73. Due to the contact portion 71 formed in such a curved structure, it is possible to avoid a situation in which the contact portion 71 damages the contact pad of the package and affects its performance.

(3) In the second embodiment, it is not necessary to provide the first pressing portion at all four corners of the square frame of the first insulator 2A. It suffices if the first pressing portion is provided at least one corner of the square frame.

(4) In the second embodiment, it is not necessary to provide the second pressing portion on all four sides of the square frame of the first insulator 2A. It suffices if the second pressing portion is provided on at least one side of the square frame.

What is claimed is:

1. An LGA socket comprising:
a center substrate configured by a multi-layer structure comprising a ground layer and a plurality of through holes formed therethrough,
a first insulator arranged around the plurality of through holes on an upper surface of the center substrate,
a second insulator arranged around the plurality of through holes on a lower surface of the center substrate, and
a plurality of pairs of contacts that are inserted into the through holes from an upper side and a lower side of the through holes and soldered via the through holes to be electrically connected to each other.

2. The LGA socket according to claim 1, wherein the contact comprises a main body portion and an insertion portion that protrudes from the main body portion at one end thereof and is inserted into the through hole, and
the insertion portions of the contacts on one side and the contacts on the other side among the plurality of pairs of contacts each comprise a press-fit structure.

3. The LGA socket according to claim 1, wherein the contact comprises a main body portion and an insertion portion that protrudes from the main body portion at one end thereof and is inserted into the through hole, and
the insertion portions of the contacts on one side and the contacts on the other side among the plurality of pairs of contacts each are configured to be bent and extend toward one side and be bent back and extend toward the other side.

4. The LGA socket according to claim 1, wherein the contact comprises a main body portion and an insertion portion that protrudes from the main body portion at one end thereof and is inserted into the through hole, and
the insertion portions of the contacts on one side among the plurality of pairs of contacts each comprise a press-fit structure, and the insertion portions of the contacts on the other side each are configured to be bent and extend toward one side and be bent back and extend toward the other side.

5. The LGA socket according to any of claim 2, wherein the contact is formed of beryllium copper as a base material, the base material is nickel-plated on the surface thereof, the nickel-plated surface is gold-plated, and the gold plate at the boundary between the main body portion and the insertion portion is peeled off to expose nickel.

6. The LGA socket according to any of claim 2, wherein the contact is formed of beryllium copper as a base material, the base material is nickel-plated on the surface thereof, the nickel-plated surface is gold-plated, and the plate on a center portion of the insertion portion in the protrusion direction is peeled off to expose nickel.

7. The LGA socket according to claim 1, wherein the first insulator is in a shape of square frame with a frontage, and metal springs to apply an inward force to a member to be fitted to the frontage are provided at four corners of the square frame, holding portions comprise recessed portions and support walls in a substantially L shape provided at the corners, in the recessed portions, substantially L-shaped portions comprising the four corners of the square frame to accommodate the metal springs being recessed outward, and the metal springs are held in the holding portions.

8. The LGA socket according to claim 1, wherein the first insulator is in a shape of square frame with a frontage, and at least one corner of the square frame is provided with a first pressing portion that applies an inward force to a member fitted to the frontage.

9. The LGA socket according to claim 8, wherein the first pressing portion comprises a first spring member as a pressing means and a first accommodation portion to accommodate the first spring member, and the first spring member is held in a first support groove formed by a first recessed portion in which a part of the inner wall surface of the square frame comprising the corners is recessed from inside to outside, and a first support wall erected along the inner wall surface.

10. The LGA socket according to claim 9, further comprising:

a second pressing portion to apply an inward force to a member to be fitted to the frontage on at least one side of the square frame.

11. The LGA socket according to claim 10, wherein the second pressing portion comprises a second spring member as a pressing means and a second accommodation portion to accommodate the second spring member, and the second spring member is held in a second support groove formed by a second recessed portion in which a part of the inner wall surface constituting the side of the square frame is recessed from inside to outside, and a second support wall erected along the inner wall surface.

\* \* \* \* \*